(12) United States Patent
Meitl et al.

(10) Patent No.: US 12,016,131 B2
(45) Date of Patent: Jun. 18, 2024

(54) TRANSFER PRINTING HIGH-PRECISION DEVICES

(71) Applicant: X Display Company Technology Limited, Dublin (IE)

(72) Inventors: Matthew Alexander Meitl, Durham, NC (US); Ronald S. Cok, Rochester, NY (US); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 17/566,593

(22) Filed: Dec. 30, 2021

(65) Prior Publication Data
US 2023/0217598 A1 Jul. 6, 2023

(51) Int. Cl.
*H05K 1/02* (2006.01)
*B41M 1/26* (2006.01)
(Continued)

(52) U.S. Cl.
CPC ............ *H05K 3/303* (2013.01); *B41M 1/26* (2013.01); *B41M 3/00* (2013.01); *H05K 1/167* (2013.01);
(Continued)

(58) Field of Classification Search
CPC ............ H05K 1/167; H05K 3/303; H05K 2203/0147; H05K 2203/0502; B42M 1/26; H01L 21/56; H01L 21/78; H01L 21/268; H01L 21/4853; H01L 21/8221; H01L 21/31051; H01L 22/12; H01L 22/14; H01L 22/22; H01L 22/24; H01L 22/32; H01L 22/34; H01L 23/544; H01L 23/585; H01L 23/3114; H01L 24/03; H01L 24/06; H01L 24/49; H01L 24/92; H01L 24/97; H01L 24/98; H01L 25/075; H01L 25/0753; H01L 25/0657; H01L 33/0095; H01L 33/38;
(Continued)

(56) References Cited

U.S. PATENT DOCUMENTS 5,982,042 A * 11/1999 Nakamura ............ H01L 22/32
257/773
6,809,031 B1 * 10/2004 Lacy .................... H01L 22/34
257/E21.243
(Continued)

*Primary Examiner* — Xiaoliang Chen
(74) *Attorney, Agent, or Firm* — Choate, Hall & Stewart LLP; Michael D. Schmitt

(57) ABSTRACT

A device source wafer includes a wafer substrate, devices formed on or in the wafer substrate at a location on the wafer substrate, and test structures disposed on the wafer substrate connected to some but not all of the devices. The devices include a first device disposed at a first location and a second device disposed at a second different location on the wafer substrate. The test structures include at least a first test structure connected to the first device and a second test structure connected to the second device. The first test structure is adapted to measuring a characteristic of the first device and the second test structure is adapted to measuring the characteristic of the second device. An estimated characteristic of unmeasured devices is derived from the first and second device locations and measured characteristics and the device is selected based on the estimated characteristic.

18 Claims, 5 Drawing Sheets

(51) Int. Cl.
  *B41M 3/00* (2006.01)
  *H01L 21/268* (2006.01)
  *H01L 21/56* (2006.01)
  *H01L 21/78* (2006.01)
  *H01L 23/544* (2006.01)
  *H01L 33/38* (2010.01)
  *H01L 33/56* (2010.01)
  *H01L 33/62* (2010.01)
  *H05K 1/16* (2006.01)
  *H05K 3/30* (2006.01)

(52) U.S. Cl.
  CPC ............. *H05K 2203/0147* (2013.01); *H05K 2203/0502* (2013.01)

(58) Field of Classification Search
  CPC ....... H01L 33/56; H01L 33/62; H01L 33/387; H01L 2224/1411; H01L 2224/16237; H01L 2224/95136; H01L 2224/91903
  USPC .......... 361/760; 257/48, 620, 686, 723, 733, 257/786; 438/14, 15, 97, 129, 396, 713, 438/733, 795
  See application file for complete search history.

(56) References Cited

U.S. PATENT DOCUMENTS

| | | | |
|---|---|---|---|
| 8,525,167 B2* | 9/2013 | Sasaki | H01L 21/56 257/773 |
| 8,722,458 B2 | 5/2014 | Rogers et al. | |
| 9,358,775 B2 | 6/2016 | Bower et al. | |
| 9,362,113 B2 | 6/2016 | Meitl et al. | |
| 9,704,821 B2 | 7/2017 | Meitl et al. | |
| 9,865,600 B2 | 1/2018 | Bower et al. | |
| 9,923,133 B2 | 3/2018 | Bower et al. | |
| 10,396,137 B2 | 8/2019 | Cok et al. | |
| 10,748,793 B1 | 8/2020 | Pearson et al. | |
| 11,088,121 B2 | 8/2021 | Pearson et al. | |
| 11,710,680 B2* | 7/2023 | Costa | H01L 23/485 257/668 |
| 2009/0121337 A1* | 5/2009 | Abe | H01L 21/268 257/E21.237 |
| 2009/0209052 A1* | 8/2009 | Val | H01L 25/50 438/15 |
| 2009/0239351 A1* | 9/2009 | Aloni | H01L 28/60 257/E21.177 |
| 2011/0095289 A1* | 4/2011 | Sasaki | H01L 21/56 257/773 |
| 2012/0129301 A1* | 5/2012 | Or-Bach | H01L 29/66833 438/129 |
| 2013/0285056 A1* | 10/2013 | Pagani | H01L 24/48 228/119 |
| 2016/0093600 A1 | 3/2016 | Bower et al. | |
| 2017/0287789 A1* | 10/2017 | Bower | H01L 24/97 |
| 2018/0090394 A1* | 3/2018 | Bower | H01L 33/56 |
| 2018/0261658 A1* | 9/2018 | Cok | G01R 31/28 |
| 2020/0052152 A1* | 2/2020 | Cok | H01L 33/62 |
| 2020/0402869 A1* | 12/2020 | Cok | H01L 25/075 |
| 2020/0402870 A1* | 12/2020 | Cok | H01L 33/62 |
| 2022/0028811 A1* | 1/2022 | Or-Bach | H01L 23/5226 |
| 2022/0108938 A1* | 4/2022 | Costa | H01L 24/03 |

* cited by examiner

TRANSFER PRINTING HIGH-PRECISION DEVICES

TECHNICAL FIELD

This disclosure relates generally to constructing high-precision devices and integrating them into electronic circuits.

BACKGROUND

High-precision and very accurate devices, such as resistors, capacitors, inductors, and transistors are important in many electronic circuits. For example, in some applications precision resistors with an accurate ohmic specification matching a circuit requirement are necessary for efficient circuit operation, such as circuits with voltage dividers or circuits requiring a specific frequency response. Small, thin-film resistors such as chip resistors have a size of approximately one to two millimeters. Large-size precision resistors with an accuracy within 0.005% are commercially available. However, smaller, sub-micron high-precision devices are not readily available and integrated circuit designs constructed using photolithography cannot use relatively large devices. For example, transistors in modern (photolithographically defined) integrated circuits can have resolutions (spacing or structure sizes) of a few nanometers to a few hundred nanometers so that high-precision components with sizes of a millimeter or more require far too much area on or in an integrated circuit.

Devices such as resistors for use within integrated circuits can be constructed using photolithographic methods and materials, but such devices suffer from variable performance due to limitations in photolithographic material deposition. For example, although the size of a resistor can be specified very accurately using photolithographic patterning technologies, the attributes of the material deposited (e.g., by sputtering, vapor deposition, or epitaxial growth) can vary significantly as can the electrical performance of resistors made in the material. Hence, the use of small high-precision devices in electronic integrated circuits is problematic.

There is a need, therefore, for small high-precision devices such as resistors useful in electronic integrated circuits and for methods of making and integrating such small high-precision resistors.

SUMMARY

The present disclosure provides, inter alia, devices, structures, systems, and methods for constructing and assembling micro-devices such as resistors or micro-resistors in a circuit or other electronic system.

According to embodiments of the present disclosure, a device source wafer comprises a wafer substrate and devices formed on or in the wafer substrate. Each of the devices is disposed at a corresponding location on the wafer substrate. The devices comprise a first device disposed at a first location on the wafer substrate and a second device disposed at a second location on the wafer substrate different from the first location. Test structures are disposed on the wafer substrate connected to a proper subset (e.g., some but not all) of the devices and comprise at least a first test structure connected to the first device and a second test structure connected to the second device. The first test structure is adapted to measuring a characteristic of the first device and the second test structure is adapted to measuring the characteristic of the second device. The devices can be micro-transfer-printable devices.

In some embodiments, the wafer substrate comprises a sacrificial layer comprising sacrificial portions and anchors spacing apart the sacrificial portions, each of the devices is disposed completely over a corresponding one of the sacrificial portions, and each of the devices is physically connected to an anchor of the anchors with a tether. Each of the devices can be suspended over the wafer substrate by a tether connected to an anchor of the anchors. The sacrificial portions can be etched to define gaps between the device disposed over the sacrificial portion and the wafer substrate.

A plurality of local devices can be disposed on or in the wafer substrate spatially closer to the first device than to the second device and the characteristic of each of the local devices can be the characteristic of the first device. A plurality of second local devices can be disposed on or in the wafer substrate spatially closer to the second device than to the first device and the characteristic of each of the local devices can be the characteristic of the second device. The characteristic of the first device can be a first characteristic, the characteristic of the second device can be a second characteristic, the devices can comprise one or more local devices disposed at corresponding device locations on the wafer substrate, and a characteristic of each of the local devices can be a combination of the first characteristic and the second characteristic. The combination can be a location-weighted combination and the location weight of each of the local devices can be a value relative to a spatial distance from the device location to the first location and to the second location.

In some embodiments, the devices comprise a third device disposed at a third location on the wafer substrate different from the first location and different from the second location, the test structures comprise at least a third test structure connected to the third device, and the third test structure is adapted to measuring the characteristic of the third device. The devices can comprise one or more local devices disposed on or in the wafer substrate and a characteristic of the one or more local devices can be a location-weighted combination of the first characteristic, the second characteristic, and the third characteristic.

According to some embodiments, each of the devices is an electrical device, an optical device, an electro-optical device, a passive device, an active device, or a resistor. Each of the devices can comprise a device circuit and connection posts that extend from the device and are electrically connected to the device circuit.

According to embodiments of the present disclosure, a high-precision device system comprises a target substrate and a high-precision device disposed on the target substrate. The high-precision device can comprise a fractured, broken, or separated tether and a characteristic of the high-precision device can be known to within 1% accuracy, within 0.5% accuracy, within 0.1% accuracy, within 0.05% accuracy, within 0.01% accuracy, within 0.005% accuracy, or within 0.001% accuracy. The high-precision device can be an electrical device, an optical device, an electro-optical device, a passive device, an active device, or a resistor.

According to embodiments of the present disclosure, a method of making a device system, comprises providing a device source wafer, measuring a characteristic of the first device (a first characteristic) using the first test structure and measuring a second characteristic of the second device (a second characteristic) using the second test structure, recording the first characteristic in association with the first location and recording the second characteristic in association with the second location, providing a target substrate, selecting a device other than the first device and other than the second device, the selection depending on spatial proximity of the device to the first location or to the second location, or both, and micro-transfer printing the selected device to the target substrate.

Because micro-transfer printing can transfer large numbers (e.g., 10,000-50,000, or even more) of small micro-devices such as micro-resistors at a time several times a minute, making a (e.g., standard size) silicon wafer with such devices from one or more source wafers is relatively simple and inexpensive and provides excellent utilization of expensive source wafers (e.g., minimizes waste), thereby reducing material costs and minimizing additional processing costs.

Embodiments of the present disclosure enable the construction and assembly of small, high-precision resistors useful in integrated circuits.

BRIEF DESCRIPTION OF THE DRAWINGS

Drawings are presented herein for illustration purposes, not for limitation. Drawings are not necessarily drawn to scale. The foregoing and other objects, aspects, features, and advantages of the disclosure will become more apparent and may be better understood by referring to the following description taken in conjunction with the accompanying drawings, in which.

DETAILED DESCRIPTION OF CERTAIN EMBODIMENTS

Figure 1A:
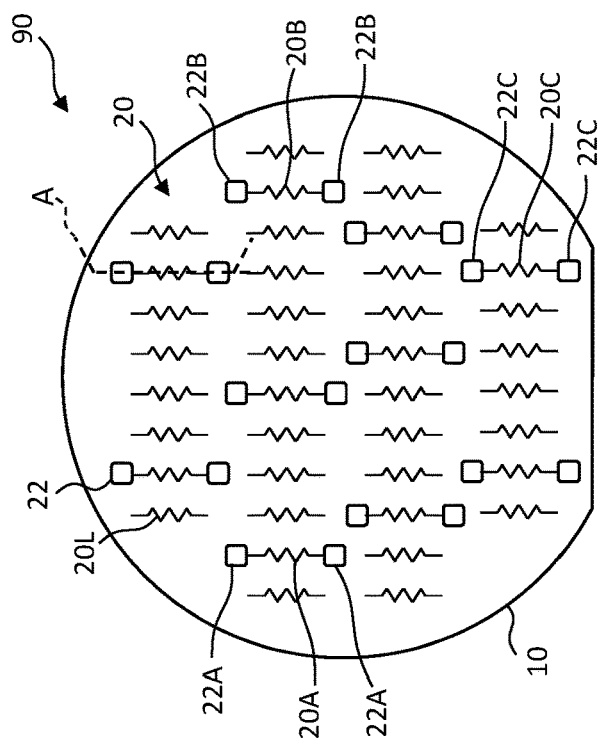
FIG. 1A is a plan view of a wafer with resistors.

Certain embodiments of the present disclosure provide, inter alia, small, high-precision devices (e.g., micro-devices such as micro-resistors) useful in integrated circuits. One or more such micro-devices can be transferred, for example using micro-transfer printing, from a device source wafer onto a target substrate comprising a desired substrate circuit and the one or more transferred devices can be electrically connected to the desired substrate circuit. Because the devices are small, they do not increase the circuit size significantly and, because the devices are high-precision, they provide excellent performance in the desired substrate circuit. The devices can be, for example, an electrical device, an optical device, an electro-optical device, a passive device, or an active device. The devices can be, for example, a resistor, a capacitor, an inductor, or a transistor. For simplicity in presentation and ease of understanding, figures of the present disclosure illustrate devices as resistors, but embodiments of the present disclosure are not limited to resistors and can include other devices with other characteristic(s), for example field-effect transistors with a desired specific current-voltage relationship.

According to embodiments of the present disclosure, a device source wafer comprises a wafer substrate and devices formed on or in the wafer substrate. Each device is disposed at a location on the wafer substrate. The devices include a first device disposed at a first location on the wafer substrate and a second device disposed at a second location on the wafer substrate different from the first location. Test structures are disposed on the wafer substrate connected to at least some of the devices. The test structures include at least a first test structure connected to the first device and a second test structure connected to the second device. The first test structure is adapted to measuring a characteristic of the first device and the second test structure is adapted to measuring the characteristic of the second device. A characteristic of a device (device characteristic) can be, for example, a performance value or performance attribute of the device. The characteristic can be a measured characteristic (e.g., measured by using the test structure) or can be an estimated characteristic. Examples of characteristics include resistivity, conductivity, current-voltage relationship, and peak emission wavelength. In some embodiments, the performance of unmeasured devices at locations on a source wafer can be estimated from the performance and location of measured devices on the source wafer. For example, U.S. Pat. Nos. 10,748,793 and 11,088,121, which are incorporated by reference herein in their entirety, describe device source wafers where characteristics of devices vary over the source wafer due to naturally occurring variations in the device source wafer. Thus, some embodiments of the present disclosure can overcome or mitigate process variability for specific devices in specific circuit applications.

By "adapted to measuring" is meant that the test structure is useful in measuring, not that the test structure necessarily performs all of the measuring. For example, and in some embodiments of the present disclosure, a test structure can be a contact pad to which a probe can be electrically connected. An electrical, optical, or electro-optical measurement device (for example an ohm-meter) can be connected to the probe to measure a characteristic of the device (e.g., a resistance of a resistor) through test structure contact pad(s). A device can be a micro-device, e.g., having a length or width, or both, no greater than 200 microns, no greater than 100 microns, no greater than 50 microns, no greater than 20 microns, no greater than 10 microns, or no greater than 5 microns. The device can have a thickness no greater than 50 microns, no greater than 20 microns, no greater than 10 microns, no greater than 5 microns, or no greater than 2 microns.

Figure 1B:
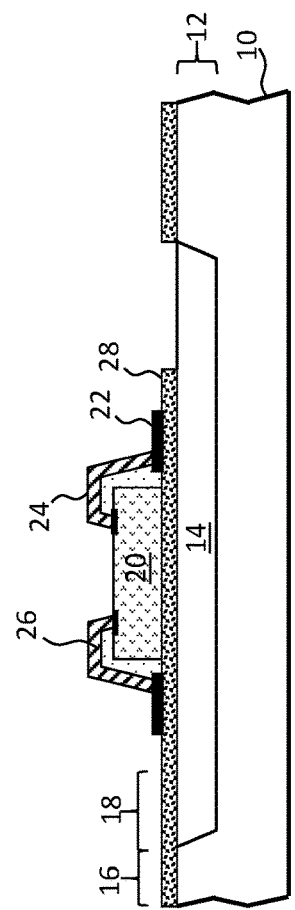
FIG. 1B is a cross section of the wafer of FIG. 1A taken across cross section line A.
Figure 1C:
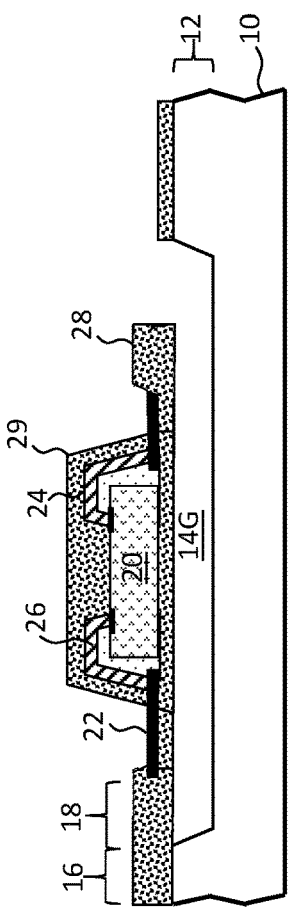
FIG. 1C is a cross section of the wafer of FIG. 1A taken across cross section line A after etching according to illustrative embodiments of the present disclosure.
Figure 2B:
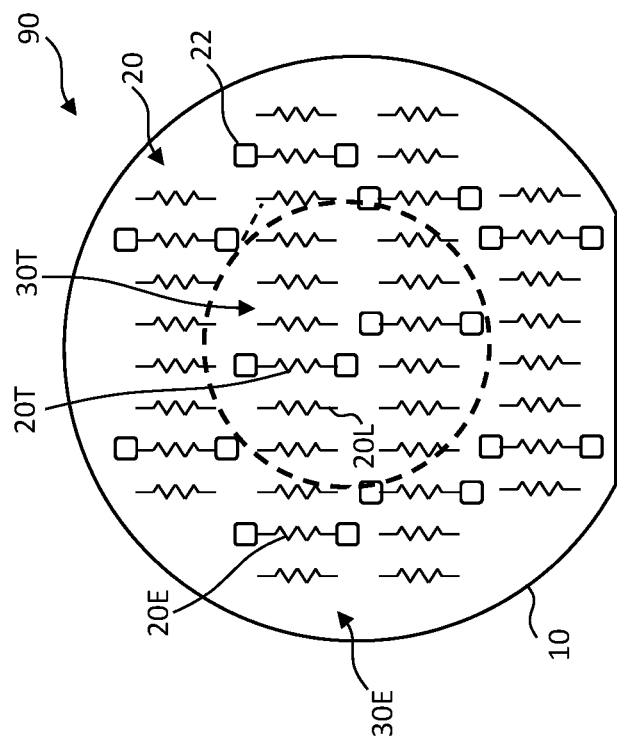
FIGS. 2A and 2B are plan views of the wafer of FIG. 1A divided into wafer portions according to illustrative embodiments of the present disclosure.

According to some embodiments of the present disclosure, and as illustrated in FIGS. 1A-2B, a device source wafer 90 with high-precision devices 20 comprises a wafer substrate 10. Devices 20 can be formed on or in, and therefore can be native to, wafer substrate 10. Devices 20 include a first device 20A disposed at a first location on wafer substrate 10 and a second device 20B disposed at a second location on wafer substrate 10 different from the first location. Test structures 22 are disposed on wafer substrate 10 that include at least a first test structure 22A electrically connected to first device 20A and a second test structure 22B electrically connected to second device 20B. FIGS. 1A, 2A, and 2B also show a third device 20C electrically connected to a third test structure 22C. First test structure 22A is adapted to measuring the resistance of first device 20A, second test structure 22B is adapted to measuring the resistance of second device 20B, and third test structure 22C is adapted to measuring the resistance of third device 20C. FIG. 2A shows a fourth device 20D electrically connected to a fourth test structure 22D adapted to measuring the resistance of fourth device 20D. FIG. 2B shows device 20E and device 20T electrically connected to test structures 22 adapted to measuring their resistance. Local devices 20L shown in FIGS. 1A, 2A, and 2B are not connected to test structures 22. (Device 20 refers collectively to all devices 20 and test structure 22 refers collectively to all test structures 22.

Figure 5:
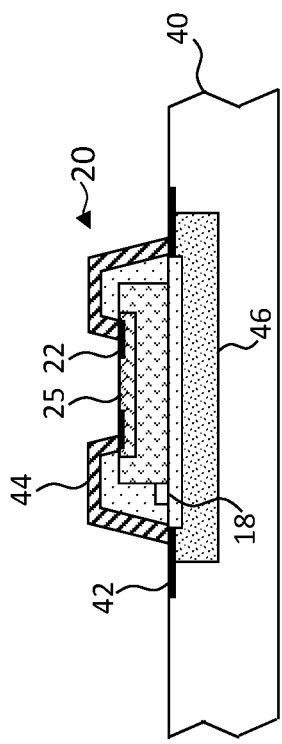
FIG. 5 is a cross section of a micro-device micro-transfer printed onto a target substrate according to illustrative embodiments of the present disclosure.

As shown in FIG. 1A, a plurality of devices 20 are disposed on and native to wafer substrate 10, including first, second, and third devices 20A, 20B, 20C. At least some (e.g., a subset) of devices 20 have test structures 22 electrically connected to devices 20, for example as shown in FIGS. 1B and 1C with device electrodes 24 insulated with dielectric structures 26. As shown in FIG. 1A, test structures 22 can be electrical contact pads for electrically contacting probes for measuring the characteristics of devices 20 electrically connected to test structure 22 contact pads. In some embodiments, more complex test structures 22 are used, for example comprising circuits that assist in measuring the resistance of devices 20 with associated test structures 22. At least first and second devices 20A, 20B are electrically connected to first and second test structures 22A, 22B, respectively, for measuring the resistance of first device 20A and second device 20B, respectively. Devices 20 can comprise a semiconductor substrate and the semiconductor substrate can be disposed on a dielectric layer 28, as shown in FIGS. 1B and 1C. Test structures 22 can be disposed on dielectric layer 28, as shown in FIGS. 1B and 1C or disposed directly on the semiconductor substrate (e.g., as shown in FIG. 5 discussed below). In some embodiments, devices 20 do not comprise a semiconductor substrate or are disposed on or comprise a different substrate, e.g., glass, polymer, quartz, ceramics, or sapphire.

Devices 20 can be micro-transfer-printable devices 20 as shown in FIGS. 1B and 1C. Wafer substrate 10 can comprise a sacrificial layer 12 comprising sacrificial portions 14 and anchors 16. Each of devices 20 is disposed completely and directly over a corresponding one of sacrificial portions 14 in a direction orthogonal to a surface of wafer substrate 10. Each device 20 is physically connected to an anchor 16 with a tether 18. Sacrificial portion 14 (shown in FIG. 1B) can be etched to form gap 14G, suspending device 20 over wafer substrate 10 with tether 18 (shown in FIG. 1C), so that device 20 can be micro-transfer printed from wafer substrate 10 to a target substrate 40 (shown in FIG. 5 discussed below), for example using a visco-elastic stamp, breaking (e.g., fracturing) or separating tether 18.

Wafer substrate 10 can be any of a variety of substrates, for example silicon or glass, suitable for constructing devices 20 and releasing devices 20 from wafer substrate 10, e.g., by etching sacrificial portions 14 to form gaps 14G and releasing devices 20 from wafer substrate 10, except for tether 18. Devices 20 can be constructed using photolithographic methods and materials, for example mask patterning of polysilicon or vapor- or sputter-deposited metals. Test structures 22 can be electrical contact pads made of patterned metal formed on and native to wafer substrate 10. If wafer substrate 10 is a semiconductor, test structures 22 can comprise circuits, for example circuits made in silicon using photolithographic processes. Sacrificial portions 14 can be buried oxide layers or, where wafer substrate 10 comprises a crystalline material such as silicon, a portion of wafer substrate can be anisotropically etched to release devices 20 from wafer substrate 10. Devices 20 can be disposed on a dielectric layer 28 disposed over a portion of sacrificial portion 14. Dielectric layer 28 can also form tether 18. In some embodiments, device 20 can be encapsulated with a dielectric layer 28 (patterned to expose test structures 22) that can form tether 18, as shown in FIG. 1C.

The processes used to deposit materials on a substrate (e.g., a wafer) are imperfect and the materials deposited can vary, for example, in their structure, purity, and thickness. For example, deposition methods such as sputtering or chemical vapor deposition can deposit varying amounts of material over the surface of the substrate. For example, some materials can be deposited in a thicker layer over some portions of the substrate than in others, so that the thickness of the deposited material over the extent of the substrate varies. Moreover, many deposition methods are done in an atmosphere or require chemical reaction or decomposition to deposit materials on a substrate surface. Atmospheric elements, reaction precursors, or reaction byproducts can all affect the attributes of deposited materials. Unwanted particles can also contaminate a deposited layer of material. In some cases, the crystallinity of a deposited layer is affected, for example forming polycrystalline structures, significant defect densities, extensive crystal lattice mismatches, or material contamination.

Because material deposited on a substrate (e.g., in a thin layer using photolithographic processes) can vary in any one or combination of thickness, structure, material composition, crystallinity, and purity, the electrical or optical attributes of the material can vary over the surface of the substrate so that it is difficult to deposit material with precise desired characteristics (e.g., resistivity). In some embodiments, the attribute variation tends to depend on the location of the material over the substrate so that material in one location will have specific attributes and material deposited in another, different, location will have somewhat different attributes, even where fabricated to intentionally have uniform attributes and therefore device characteristic. In some cases, the attributes of a device made of such deposited materials are measured and then the device is modified to precisely specify the desired device characteristic (e.g., resistivity), for example by laser trimming (ablating, removing, or cutting away material) to adjust the operating parameters of the device. Although this method is used in industrial processes, it is relatively expensive and slow and is difficult to apply to very large quantities of very small micro-devices, for example devices used in micro-transfer printing.

Figure 2A:
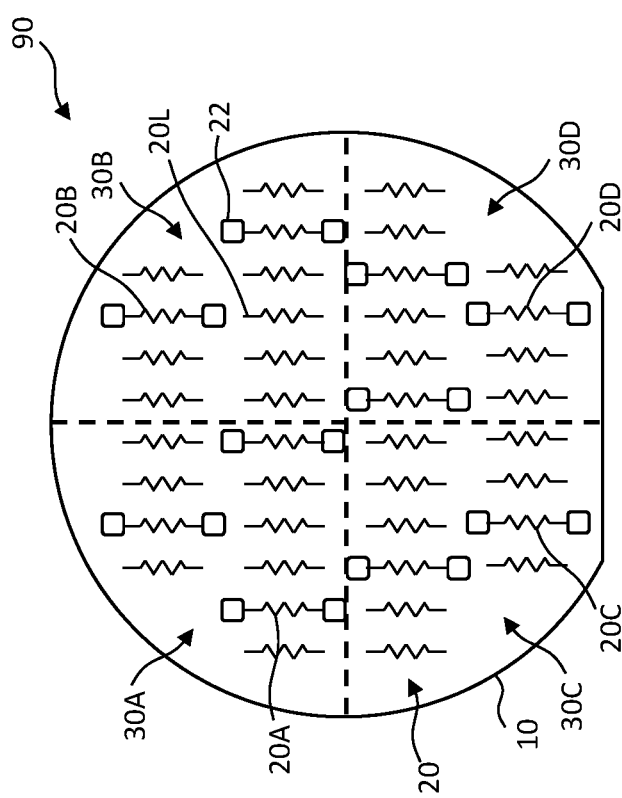

As shown in FIGS. 1A, 2A, and 2B, according to embodiments of the present disclosure, these issues can be mitigated by providing a device source wafer 90 comprising a wafer substrate 10 with devices 20 (such as resistors) formed over wafer substrate 10 with characteristics as close to desired as reasonable using available methods and materials. However, the performance of devices 20 will vary over wafer substrate 10. In some embodiments, if the characteristics of two or more (but not all) of devices 20 are measured with respect to the location of devices 20 over wafer substrate 10 using test structures 22, the characteristics of some or all remaining devices 20 (local devices 20L) can be estimated using the characteristics and location of the measured devices 20 relative to the location of local devices 20L. In some embodiments, a relationship between the material location and the characteristics of the material can be derived and used to predict the performance, such as resistance, of a device 20, such as a resistor, depending on the location of device 20 on wafer substrate 10 with respect to the measured performance and location of measured devices 20.

FIG. 2A illustrates one or more devices 20 disposed in quadrants 30A, 30B, 30C, and 30D of wafer substrate 10. FIG. 2B illustrates one or more edge devices 20E disposed in an edge portion 30E of wafer substrate 10 and one or more central devices 20T disposed in a central portion 30T of wafer substrate 10. Quadrants 30A, 30B, 30C, and 30D, edge portion 30E, and central portion 30T are collectively wafer portions 30 of wafer substrate 10. Devices 20 disposed in a common wafer portion 30 of wafer substrate 10 can have similar estimated characteristics and can be selected based on their estimated characteristics.

Figure 3:
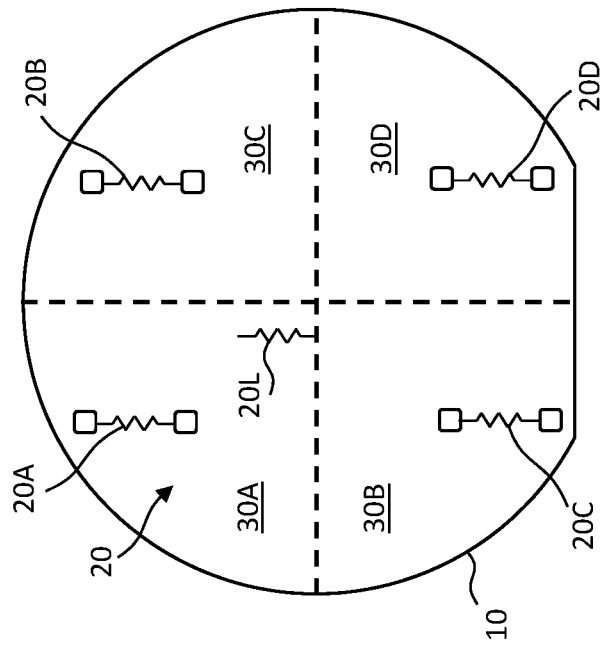

FIG. 3 illustrates a simplified arrangement of first and second devices 20A, 20B and local devices 20L (collectively devices 20, for clarity only labeled devices 20A, 20B, and 20L are shown in FIG. 3). The characteristics of first and second devices 20A and 20B are measured and their location recorded. The characteristics of local devices 20L can then be estimated based on their spatial location with respect to the measured first and second devices 20A, 20B. In some methods, wafer substrate 10 is divided into wafer portions 30 (for example quadrants 30A, 30B, 30C, 30D indicated by the dashed lines) and the performance of a device 20 in each wafer portion 30 is measured. In some embodiments, all of the devices 20 in the wafer portion 30 can then be assumed to have the same estimated or measured characteristics.

Thus, if a device 20 having the measured characteristic of first device 20A is desired, a device 20 in the same wafer portion 30 (e.g., quadrant 30A) is micro-transfer printed to a target substrate 40 for a desired electronic circuit 46 (shown in FIG. 5 discussed below). If a device 20 having the measured characteristic of second device 20B is desired, a device 20 in the same wafer portion 30 (e.g., quadrant 30B) is micro-transfer printed to a target substrate 40 for a desired electronic circuit 46. Devices 20 in a common wafer portion 30 are local devices 20L and assumed to have similar performance within an acceptable range (e.g., of the measured characteristic). In some embodiments, the characteristic of a local device 20L is estimated to be the same as the characteristic of the closest measured device 20. For example, as shown in FIG. 3, a local device 20L in fourth quadrant 30D is closest to second device 20B in quadrant 30B and its characteristic estimated to be the same as the characteristic of second device 20B. If more than one device 20 is measured within a wafer portion 30, local devices 20L in wafer portion 30 can be assumed to have the average characteristic of measured devices 20. Therefore, according to some embodiments, a device source wafer 10 comprises a plurality of local devices 20L disposed on or in wafer substrate 10 spatially closer to first device 20A than to second device 20B and the characteristic of local devices 20L can be the characteristic of first device 20A. Similarly, if a device source wafer 10 comprises a plurality of local devices 20L disposed on or in wafer substrate 10 spatially closer to second device 20B than to first device 20A then the characteristic of local devices 20L can be the characteristic of second device 20B. Source wafer 10 has been described as being divided into quadrants but analogous embodiments using finer divisions may be considered, for example using eighths, sixteenths, tenths, hundredths, or thousandths. A division can have any useful shape, for example a rectangle, a sector (pie shape), a disc, or a two-dimensional torus. In some embodiments, the characteristic varies in an x or y dimension or both, or radially over the surface of device source wafer 10. The characteristic variation can be linear, can be monotonic, or can repeat (e.g., vary sinusoidally) over the surface. However, embodiments of the present disclosure are not limited to such shapes or variations.

In some methods, the performance and location of two or more devices 20 is measured. The performance of local devices 20L on substrate 10 is then derived based on a model of device 20 performance with respect to measured device 20 characteristics and location on wafer substrate 10 relative to measured devices 20. For example, where devices 20 are resistors, the variation in characteristic (resistor performance (resistivity)) over substrate 10 can be assumed to be linear with respect to spatial distance from the measured performance of resistors 10. If first resistor 20A at location $L_A$ has a resistance $R_A$ and second resistor 20B at location $L_B$ has a resistance $R_B$, then third resistor 20C at location $L_C$ in a line relative to $R_A$ and $R_B$ can be assumed to have a resistance:

$$R_C = (((L_C - L_A)/(L_B - L_A))*(R_B - R_A)) + R_A.$$

In the example of FIG. 3, if $R_D$ is disposed at $L_D$ and if $R_A$ is 10 k ohms, $R_B$ is 11 k ohms, $L_A$ is 40, $L_B$ is 100, $L_C$ is 60, and $L_D$ is 80 (in arbitrary units), then $(L_B - L_A)$ is 60 and $(R_B - R_A)$ is 1 k ohms. $R_C$ is $((60-40)/60)*1$ k ohms)+10 k ohms=1333 k ohms. $R_D$ is $((80-40)/60)*1$ k ohms)+10 k ohms=1667 k ohms.

Therefore, according to some embodiments of the present disclosure, if the characteristic of first device 20A is a first characteristic, the characteristic of second device 20B is a second characteristic, devices 20 comprise one or more local devices 20L disposed at corresponding device locations on wafer substrate 10, then the characteristic of each local device 20L can be a combination of the first characteristic and the second characteristic. The combination can be a location-weighted combination and the location weight of each local device 20L can be a value relative to a spatial distance from local device 20L location to the first location and from local device 20L location to the second location.

Models other than linear can be used to estimate resistor 20 performance with respect to resistor location on substrate. For example, if three resistors 20 in a line are measured, a non-linear (e.g., square, cubic, or exponential) relationship between resistor 20 location and resistivity can be derived and applied to resistors 20 on the line.

In some embodiments, three or more devices 20 not all in a line are measured to model a two-dimensional variation in material performance that is used to estimate device 20 characteristic(s) with respect to location over substrate 10. Variation in two dimensions of materials deposited on source wafer 10 can affect the performance of devices 20. As will be appreciated by those knowledgeable in mathematics, a variety of algorithms or models can be used to estimate the performance of devices 20 (e.g., devices 20L) at different locations on source wafer 10. In some embodiments, each device 20 has an x and y location L(x, y) on the surface of source wafer 10 in Cartesian coordinates. Devices 20 with test structures 22 can be measured and their performance with respect to their location L(x, y) can be used to model the performance of any device 20 disposed at any location (x, y) on source wafer 10.

Figure 4:
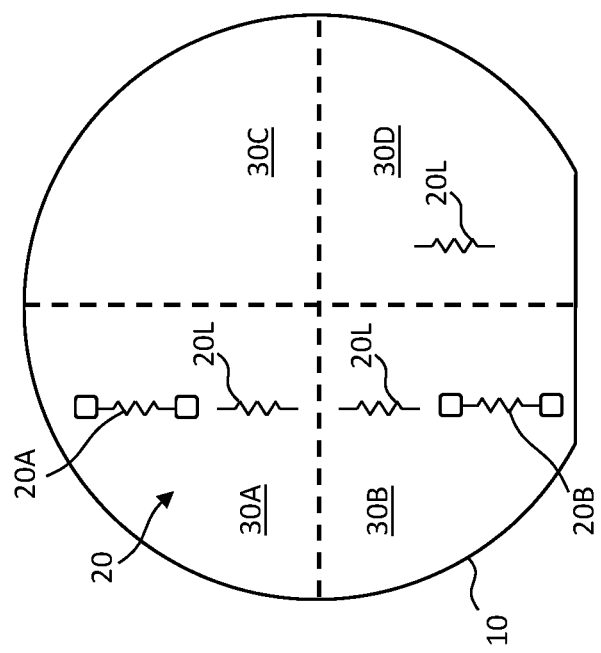
FIGS. 3 and 4 are plan views of wafers showing selected resistors according to illustrative embodiments of the present disclosure.

For example, FIG. 4 illustrates four resistors 20 (first, second, third, and fourth resistors 20A, 20B, 20C, and 20D) each with a test structure 22 at a location in each separate quadrant (e.g., first, second, third, or fourth quadrant 30A, 30B, 30C, 30D) of source wafer 10. The performance of local device 20L can be estimated using the equation above for each pair of tested devices 20 in each of the x dimension and the y dimension (x, y), resulting in four estimates $R_{AB}$, $R_{CD}$, $R_{AC}$, and $R_{BD}$. The four estimates can then be averaged to calculate a final estimate of the local device 20L performance $R_L$. For example, if $R_A$ is 10 k ohms, $R_B$ is 11 k ohms, $R_C$ is 12 k ohms, $R_D$ is 14 k ohms, $L_A$ is (40, 40), $L_B$ is (100, 50), $L_C$ is (45, 110), $L_D$ is (110, 130), and $L_X$ is (60, 70) (in arbitrary units), then $R_{AB}$ is 10.33 k ohms, $R_{CD}$ is 12.46 k ohms, $R_{AC}$ is 10.86 k ohms, $R_{BD}$ is 11.75 k ohms, and $R_L$ is then 11.35 k ohms.

Therefore, according to some embodiments of the present disclosure, device source wafer 10 can comprise a third device 20C disposed at a third location on wafer substrate 10 different from the first location and different from the second location, test structures 22 include at least a third test structure 22C connected to third device 20C. Third test structure 22C is adapted to measure the characteristic of third device 20C. The characteristic of the one or more local devices 20L can then be a location-weighted combination of the first characteristic, the second characteristic, and the third characteristic.

Generally, and according to some embodiments of the present disclosure, a characteristic with respect to spatial location over wafer substrate 10 can be derived from a model of attributes or measured material attributes on wafer substrate 10. In some embodiments, a combination of measured characteristics and knowledge of material deposition properties are used to estimate the performance of devices 20 on substrate 10.

According to some embodiments, a map and lookup table of device 20 characteristics or an algorithm for locating a device 20 with a desired characteristic generated (e.g., a predictive equation of location and characteristic) can be generated and used to select a desired device for a specific known application and circuit. As shown in FIG. 5, devices 20 having a desired characteristic can be selected from devices 20 on wafer substrate 10 using the measured or estimated characteristics of devices 20, micro-transfer printed to a desired target substrate 40, and electrically connected to a substrate contact pad 42 on target substrate 40 with a substrate electrode 44 into a desired electronic substrate circuit 46, for example by using photolithographic methods and materials such as forming metal wires on target substrate 40 to electrically connect the micro-transfer printed resistor 20.

Figure 6:
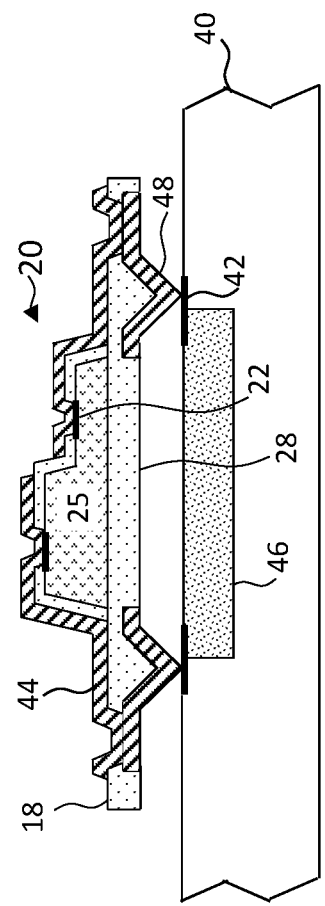
FIG. 6 is a cross section of a micro-device with connection posts micro-transfer printed onto a target substrate according to illustrative embodiments of the present disclosure.

In some embodiments and as shown in FIG. 6, devices 20 comprise a connection post 48 that extends from a device substrate 52 and is electrically connected to a device circuit 25 of device 20. When device 20 is micro-transfer printed from source wafer 10 to target substrate 40, connection post 48 can electrically connect device circuit 25 to substrate contact pad 42 and substrate circuit 46. As shown in FIG. 6, device 20 is a horizontal inorganic micro-light-emitting diode.

Thus, according to embodiments of the present disclosure, a high-precision device system comprises a target substrate 40 and a high-precision device 20 disposed on target substrate 40. High-precision device 20 can comprise a broken (e.g., fractured) or separated tether 18. Because the performance of device 20 can be accurately measured or estimated based on accurate measurements, a characteristic of high-precision device 20 can be known to within 1% accuracy, within 0.5% accuracy, within 0.1% accuracy, within 0.05% accuracy, within 0.01% accuracy, within 0.005% accuracy, within 0.001% accuracy. The high-precision device 20 can be an electrical device, an optical device, an electro-optical device, a passive device, an active device. The high-precision device 20 can be a resistor.

Figure 7:
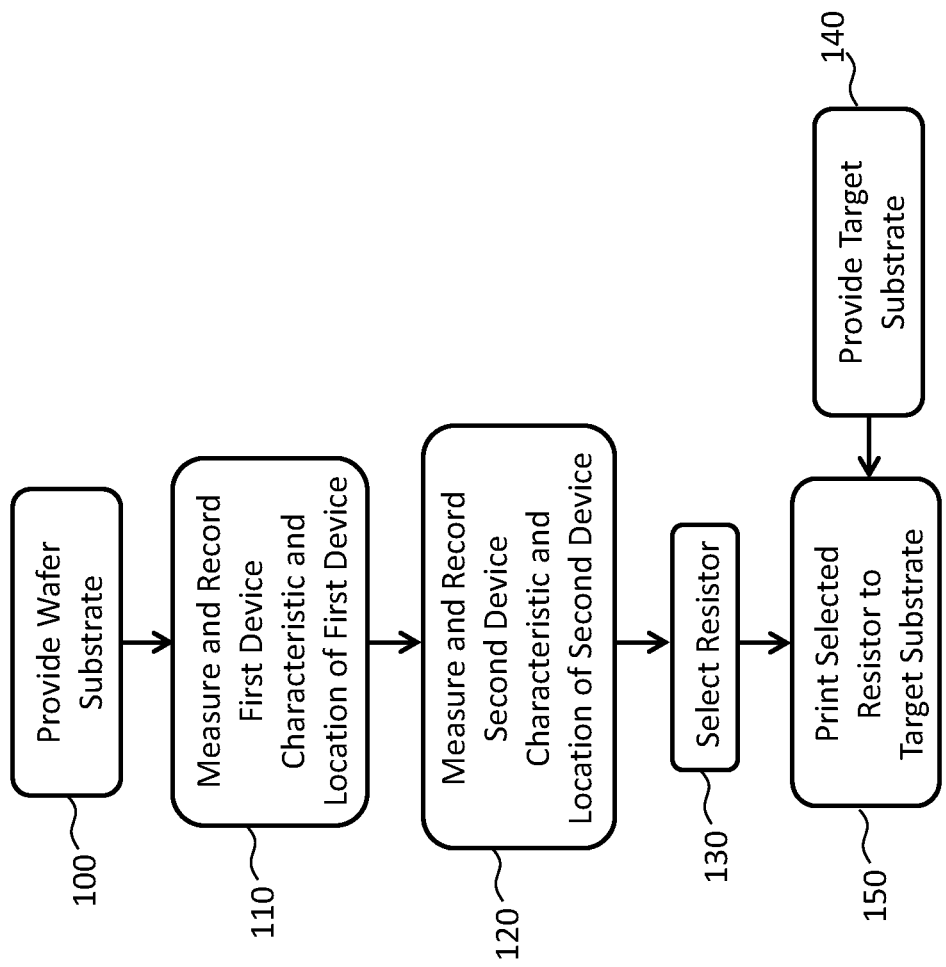
FIG. 7 is a flow diagram of illustrative methods according to embodiments of the present disclosure.

According to embodiments of the present disclosure and as illustrated in the flow diagram of FIG. 7, a method of making a device system comprises providing a device source wafer 10 in step 100, measuring a first characteristic of first device 20A using first test structure 22A and recording the first characteristic in association with the first location in step 110, measuring a second characteristic of second device 20B using second test structure 22B and recording the second characteristic in association with the second location in step 120, in step 130 selecting a device 20 other than first device 20A and other than second device 20B (e.g., a local device 20L), and providing a target substrate 40 in step 140. The selection can depend on a device 20 estimated characteristic derived from the spatial proximity of the device to the first location or to the second location, or both. Some embodiments comprise micro-transfer printing the selected device 20 from source wafer 10 to target substrate 40 in step 150.

Devices 20 can be native to source wafer 10 and non-native to target substrate 40. Devices 20 can be micro-devices having a length or width, or both length and width, no greater than 200, 100, 50, 20, or 10 microns and, optionally, a thickness no greater than 100, 50, 20, 15, 10, or 5 microns.

Various embodiments of structures and methods are described herein that include (e.g., were made by) printing devices 20. Printing may include or be micro-transfer printing. As used herein, micro-transfer-printing involves using a transfer device (e.g., a visco-elastic elastomeric stamp, such as a polydimethylsiloxane (PDMS) stamp) to transfer a device 20 using controlled adhesion. For example, an exemplary transfer device can use kinetic, rate-dependent, or shear-assisted control of adhesion between a transfer device (e.g., stamp) and a device 20. It is contemplated that, in certain embodiments, where a method is described as including micro-transfer-printing a device 20, other analogous embodiments exist using a different transfer method. In methods according to certain embodiments, a vacuum tool, electrostatic tool, or other transfer device is used to print a device 20.

Examples of micro-transfer printing processes suitable for printing devices 20 onto target substrates 40 are described in U.S. Pat. No. 8,722,458 entitled Optical Systems Fabricated by Printing-Based Assembly, U.S. Pat. No. 9,362,113 entitled Engineered Substrates for Semiconductor Epitaxy and Methods of Fabricating the Same, U.S. Pat. No. 9,358,775 entitled Apparatus and Methods for Micro-Transfer-Printing, U.S. patent application Ser. No. 14/822,868, filed on Aug. 10, 2015, entitled Compound Micro-Assembly Strategies and Devices, and U.S. Pat. No. 9,704,821 entitled Stamp with Structured Posts, each of which is hereby incorporated by reference herein in its entirety.

It is contemplated that systems, devices, methods, and processes of the disclosure encompass variations and adaptations developed using information from the embodiments described herein. Adaptation and/or modification of the systems, devices, methods, and processes described herein may be performed by those of ordinary skill in the relevant art.

Throughout the description, where articles, devices, and systems are described as having, including, or comprising specific components, or where processes and methods are described as having, including, or comprising specific steps, it is contemplated that, additionally, there are articles, devices, and systems according to certain embodiments of the present disclosure that consist essentially of, or consist of, the recited components, and that there are processes and methods according to certain embodiments of the present disclosure that consist essentially of, or consist of, the recited processing steps.

It should be understood that the order of steps or order for performing certain actions is immaterial so long as operability is not lost. Moreover, two or more steps or actions may be conducted simultaneously.

Certain embodiments of the present disclosure were described above. It is, however, expressly noted that the present disclosure is not limited to those embodiments, but rather the intention is that additions and modifications to what was expressly described in the present disclosure are also included within the scope of the disclosure. Moreover, it is to be understood that the features of the various embodiments described in the present disclosure were not mutually exclusive and can exist in various combinations and permutations, even if such combinations or permutations were not made express, without departing from the spirit and scope of the disclosure. Having described certain implementations of heterogeneous wafer structures, heterogeneous semiconductor structures, methods of their fabrication, and methods of their use, it will now become apparent to one of skill in the art that other implementations incorporating the concepts of the disclosure may be used. Therefore, the claimed invention should not be limited to certain expressly described implementations, but rather should be limited only by the spirit and scope of the following claims.

PARTS LIST

L location
R resistance/resistivity
10 wafer substrate
12 sacrificial layer
14 sacrificial portion
14G gap
16 anchor
18 tether
20 device/resistor
20A first device/first resistor
20B second device/second resistor
20C third device/third resistor
20D fourth device/fourth resistor
20E edge device/edge resistor
20L local device/local resistor
20T central device/central resistor
22 test structure
22A first test structure
22B second test structure
22C third test structure
24 device electrode
25 device circuit
26 dielectric structure
28 dielectric layer
29 encapsulation layer
30 wafer portion
30A, 30B, 30C, 30D quadrant
30E edge portion
30T central portion
40 target substrate
42 substrate contact pad
44 substrate electrode
46 substrate circuit
48 connection post
90 device source wafer
100 provide wafer substrate step
110 measure and record first resistance and location of first device step
120 measure and record second resistance and location of second device step
130 select device step
140 provide target substrate step
150 print selected device to target substrate step

What is claimed is:

1. A device source wafer, comprising:
a wafer substrate;
devices formed on or in the wafer substrate such that the devices are native to the wafer substrate, each of the devices disposed at a location on the wafer substrate, the devices comprising a first device disposed at a first location on the wafer substrate and a second device disposed at a second location on the wafer substrate, different from the first location; and
test structures disposed on and native to the wafer substrate connected to a proper subset of the devices for testing the devices on the source wafer, the test structures comprising at least a first test structure connected to the first device and a second test structure connected to the second device,
wherein the first test structure is adapted to measuring a characteristic of the first device and the second test structure is adapted to measuring the characteristic of the second device,
wherein the wafer substrate comprises a sacrificial layer comprising sacrificial portions and anchors spacing apart the sacrificial portions, each of the devices is disposed completely over a corresponding one of the sacrificial portions, and each of the devices is physically connected to an anchor of the anchors with a tether,
wherein some but not all of the devices are electrically connected to test structures.

2. The device source wafer of claim 1, comprising a plurality of local devices disposed on or in the wafer substrate spatially closer to the first device than to the second device and the characteristic of each of the local devices is the characteristic of the first device.

3. The device source wafer of claim 2, comprising a plurality of second local devices disposed on or in the wafer substrate spatially closer to the second device than to the first device and the characteristic of each of the second local devices is the characteristic of the second device.

4. The device source wafer of claim 2, wherein the test structures are disposed over the wafer and the local devices are disposed relative to the first device such that the characteristic of each of the local devices is knowable within 1% accuracy based on the characteristic of the first device.

5. The device source wafer of claim 3, wherein the test structures are disposed over the wafer and the second local devices are disposed relative to the first device such that the characteristic of each of the second local devices is knowable within 1% accuracy based on the characteristic of the second device.

6. The device source wafer of claim 1, wherein the devices comprise a third device disposed at a third location on the wafer substrate different from the first location and different from the second location, the test structures comprise at least a third test structure connected to the third device, and the third test structure is adapted to measuring the characteristic of the third device.

7. The device source wafer of claim 6, wherein the devices comprise one or more local devices disposed on or in the wafer substrate and a characteristic of the one or more local devices is a location-weighted combination of the first characteristic, the second characteristic, and the third characteristic.

8. The device source wafer of claim 1, wherein each of the devices is an electrical device, an optical device, an electro-optical device, a passive device, an active device, or a resistor.

9. The device source wafer of claim 1, wherein each of the devices comprises a device circuit and connection posts that extend from the device and are electrically connected to the device circuit.

10. The device source wafer of claim 1, wherein the characteristic of the first device is a first measured performance attribute of the first device, the characteristic of the second device is a second measured performance attribute of the second device, the devices comprise one or more local devices disposed at corresponding device locations on the wafer substrate, and a measured performance attribute of each of the local devices is a combination of the first measured performance attribute and the second measured performance attribute, wherein the first performance attribute and the second performance attribute are the same attribute but different measured performances.

11. The device source wafer of claim 10, wherein the first performance attribute and the second performance attribute are at least one of resistance, capacitance, inductance, a current-voltage relationship, and a peak emission wavelength.

12. The device source wafer of claim 1, wherein each of the devices is a passive device.

13. The device source wafer of claim 1, wherein each of the devices is a resistor or a micro-resistor.

14. The device source wafer of claim 1, wherein the test structures are disposed over the wafer such that a characteristic of the devices is knowable within 1% accuracy.

15. The device source wafer of claim 1, wherein the test structures are disposed over the wafer such that a characteristic of the devices is knowable within 0.1% accuracy.

16. The device source wafer of claim 1, wherein the devices comprise one or more local devices different from the first device and the second device and the one or more local devices are disposed between the first device and the second device.

17. The device source wafer of claim 16, wherein the characteristic of the first device is a first characteristic, the characteristic of the second device is a second characteristic, the devices comprise one or more local devices disposed at corresponding device locations on the wafer substrate, and a characteristic of each of the local devices is a combination of the first characteristic and the second characteristic.

18. The device source wafer of claim 17, wherein the combination is a location-weighted combination and the location weight of each of the local devices is a value relative to a spatial distance from the device location to the first location and to the second location.

* * * * *